May 14, 1968 N. C. TURNER ET AL 3,383,571
HIGH-FREQUENCY POWER TRANSISTOR WITH IMPROVED REVERSE-BIAS SECOND BREAKDOWN CHARACTERISTICS
Filed July 19, 1965
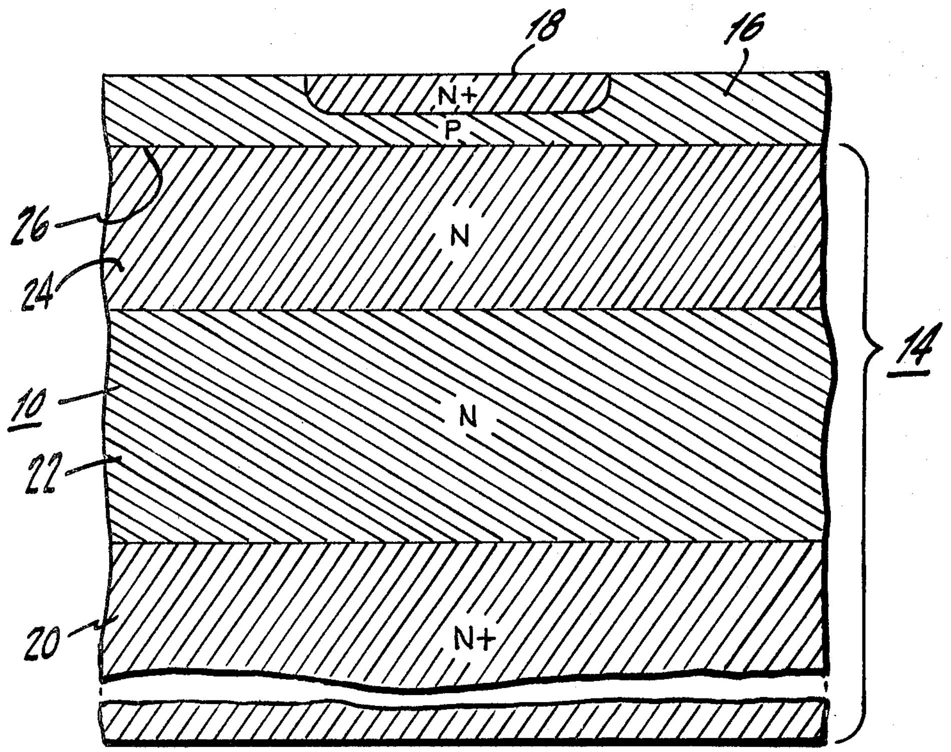
INVENTORS
ALBERT F. CHEN,
BOHDAN R. CZORNY &
NORMAN C. TURNER
BY Glenn H. Burnette
ATTORNEY United States Patent Office 3,383,571

Patented May 14, 1968

3,383,571
HIGH-FREQUENCY POWER TRANSISTOR WITH IMPROVED REVERSE-BIAS SECOND BREAKDOWN CHARACTERISTICS

Norman C. Turner, Hopatcong, and Albert F. Chen and Bohdan R. Czorny, Bound Brook, N.J., assignors to Radio Corporation of America, a corporation of Delaware Filed July 19, 1965, Ser. No. 472,796
5 Claims. (Cl. 317—235)

ABSTRACT OF THE DISCLOSURE

A high-frequency power transistor with improved reverse-bias second breakdown characteristics comprises an emitter region, a base region, and a multi-layer collector region. The collector region comprises at least three layers whose resistivities decrease step-wise, respectively, in the direction away from the base region. The two layers nearest the base region have thicknesses of about the same order of magnitude.

This invention relates generally to semiconductive devices, and more particularly to an improved transistor having improved reverse-bias second breakdown and voltage ratings. The improved transistor of the present invention is particularly useful as a high frequency, power transistor of the type used in regulated power supplies, converters, inverters, amplifiers, and the like.

When current in a circuit employing a transistor and an inductive load is suddenly interrupted, a resulting induced voltage may cause the collector space charge layer in the transistor to spread through the active collector region of the transistor, the active collector region being that portion of the collector material beneath the base region and above the highly doped substrate of the transistor. If this occurs, base widening results and the possibility of a second voltage breakdown, depending on the impurity level of the substrate, is presented. This condition, if allowed to persist, would greatly reduce the transistor output impedance, and large currents would flow. Such action would produce an excessive heating of the transistor, resulting in its eventual destruction. The resulting induced voltage of an inductive load may also cause a very high current to flow through the collector region of the transistor under breakdown voltage conditions. Thus, a high current density and a high electric field may exist at the collector junction simultaneously. In some transistors, these conditions may precipitate a localized thermal runaway. This is especially true when crystallographic defects and/or non-uniform impurity regions exist in the base of the active collector regions of the transistor. Under these conditions, second breakdown is said to occur in the transistor. If the transistor's emitter-base junction is not forward based, as in the case where an inductive circuit is suddenly interrupted, the second breakdown is referred to as a reverse-bias second breakdown.

In general, second breakdown in a junction transistor is a condition in which the output impedance changes instantaneously from a very large positive value to a negative value, then to a final small positive value. In some respects, the second breakdown appears similar to a normal avalanche breakdown, either collector-to-base or collector-to-emitter.

Physically, second breakdown is a local thermal runaway effect induced by severe current concentrations in the transistor. These concentrations of current can result from improper biasing conditions, excessive transverse base fields, or defects in the base region and/or junctions.

Second breakdown can occur to some degree in all junction transistors. In many low frequency and low-power transistors, for example, the maximum steady state dissipation rating limits the voltage-current product to something less than the critical value necessary to produce second breakdown. In relatively high-frequency, high-power transistors, however, the increased criticalness of their structural tolerances and the increased severity of their operating conditions cause them to have relatively lower second breakdown power ratings.

It is an object of the present invention to provide an improved transistor with improved reverse-bias second breakdown characteristics.

Another object of the present invention is to provide an improved transistor of the type described that is relatively simple in structure, inexpensive to manufacture, and highly efficient in use.

Briefly described, the improved transistor comprises an emitter region, a base region, and a collector region, the latter region having a resistivity that decreases substantially stepwise in the direction away from the base region.

The collector region may comprise two or more collector layers of semiconductive material. Where the collector region comprises only two collector layers, at least one collector layer should have a resistivity that decreases stepwise in a direction away from the base region. In a preferred embodiment of the invention, the collector region comprises three collector layers of the same conductivity type, one collector layer being adjacent to the base region and having a resistivity that is greater than that of an adjacent collector layer, and the latter collector layer having a resistivity that is greater than that of a heavily doped substrate collector layer.

The novel features of the invention, as well as the invention itself, both as to its organization and method of operation, will be understood more fully when considered in connection with the accompanying drawing, the single figure of which is a fragmentary, cross-sectional view of the improved transistor.

Referring now to the drawing, there is shown a fragment of an improved NPN transistor 10 of semiconductive material, such as silicon or germanium, for example, comprising a combined collector region 14, a base region 16, and an emitter region 18.

While the transistor 10 is of the NPN type, it is merely illustrative of one embodiment of the invention, and it is also within contemplation of the present invention to provide improved PNP transistors with improved second breakdown characteristics.

The combined collector region 14 comprises a substrate collector layer 20 of degenerate semiconductive material, such as a wafer of highly doped, N type, monocrystalline silicon, indicated in the drawing by the symbol N+. The dimensions and resistivities given for the illustrated embodiment herein are for improved transistors of the 2N3265 type (medium voltage, high power, mesa NPN silicon transistors). The substrate collector layer 20 may have a thickness of between 6.5 and 7.0 mils and a resistivity of less than 0.01 ohm-cm. These specifications are not critical and transistors of other types employing the improved structure may have different dimensions and resistivities.

The combined collector region 14 may comprise, in addition to the substrate collector layer 20, at least two superimposed collector layers 22 and 24, of different resistivities, respectively, preferably formed by successive epitaxial depositions, on the substrate collector layer 20. For example, the collector layer 22 may have a thickness of 0.7 mil and a resistivity between 1.5 and 3 ohm-cm., and the collector layer 24 may have a thickness of about 0.7 mil and a resistivity between 9 and 15 ohm-cm. While only the three layers 20, 22, and 24 are shown herein as comprising the collector region 14, it is within the contemplation of the invention to provide a plurality of collector layers for the combined collector region 14, wherein the further each collector layer is from the base region 16, the lower is its respective resistivity. The resistivity of each collector layer may also vary slightly within each layer.

While the collector layers 22 and 24 have been described herein as being separately formed, epitaxial layers, such a method of manufacture being a preferred one, it is within the contemplation of the invention to substitute a single, epitaxially deposited layer, having a thickness and stepwise resistivity similar to that of the combined layers 22 and 24, for the layers 22 and 24. Such a stepwise resistivity in a single collector layer can be obtained by controlling the concentration of the dopant, such as phosphorus pentoxide, during the epitaxial deposition of the layer on the substrate collector layer 20.

The base region 16 may be easily formed in the collector layer 24 by diffusing a P type dopant into the layer 24 to a depth of about 0.2 mil, by any means well known in the transistor art. The junction of the base region 16 and the collector layer 24 form a PN rectifying junction 26.

An N type dopant is diffused into a portion of the base region 16 to a depth of about .1 mil, by any means known in the art, to provide the emitter region 18. The emitter region 18 is heavily doped by an N type dopant and is designated by the symbol N+ in the drawing. The emitter region 18 may also be formed by an alloying process well known in the art.

The resistivity of the collector layer 24 controls the avalanche breakdown voltage of the collector-base junction 26 of the transistor, and, hence, determines the transistor's breakdown voltage characteristics. The thickness of the collector layer 24 determines the allowable space-charge widening, which, if impeded, would lower the voltage breakdown. The thickness of the collector layer 24 also determines the largest part of the transistor's collector series resistance, a function of the current-carrying capacity of the transistor 10. For any particular application of the transistor 10, the resistivity and thickness of the collector layer 24 should provide the highest voltage breakdown rating commensurate with a minimum of collector series resistance.

The resistivity of the collector layer 22 is a function of the maximum current density before reverse-bias second breakdown of the transistor occurs. The thickness of the collector layer 22 is a function of the permissible widening of the collector space charge layer. Hence, the resistivity and thickness of the collector layer 22 determine the magnitude of reverse-bias second breakdown protection of which the transistor 10 is capable. The resistivity-thickness product should be kept small so as to keep the saturation resistance low and thereby enhance the current-carrying capacity of the transistor 10. The resistivity of the collector layer 22, however, should be high enough to prevent it from limiting the transistor's voltage ratings.

In operation, the collector layer 22 of the collector region 14 retards the spreading of the collector space charge layer to prevent it from contacting the heavily doped substrate layer 20 in the area where currents of high density are flowing. The collector layer 24 of the collector region 14 provides a thickness necessary to support at least one-half of a space charge layer at a theoretical breakdown voltage for a given resistivity. By employing three collector layers 20, 22, and 24 whose resistivities increase substantially stepwise, respectively, towards the base region 16, the collector layer 22 functions as a distinct buffer in a zone where high current densities occur and thereby reduces the possibility of second breakdown.

In improved transistors of the high voltage type, in accordance with the present invention, the substrate collector layer 20 may have a thickness between 5 and 7 mils and a resistivity of less than .01 ohm-cm.; the collector layer 22 may have a thickness of 1.6 mils and a resistivity of between 2.5 and 4.0 ohm-cm.; and the collector layer 24 may have a thickness of 2 mils and a resistivity of between 20 and 40 ohm-cm. The base of the transistor is diffused into the collector layer 24 to a depth of about 0.7 mil and the emitter is diffused into a portion of the base region 18 to a depth of about .3 mil.

Generally, the specifications of collector region 14 of the transistor 10 may vary as follows: the thickness of the substrate collector layer 20 may vary between 3 and 10 mils, and have a resistivity of less than 0.01 ohm-cm. The thickness of the collector layer 22 may vary between 0.5 and 2 mils, and have a resistivity bewcen 0.3 and 5 ohm-cm.; and the layer 24 may have a thickness between 0.5 and 3 mils, and a resistivity between 1.0 and 80 ohm-cm.

From the foregoing description, it is apparent that there has been provided an improved transistor employing a collector region whose resistivity decreases substantially stepwise, in the direction away from its base region. The improved transistor provides a relatively low saturation resistance and relatively high reverse-bias second breakdown energy capability. While only one example of the improved transistor has been described in detail, variations in its structure, as well as in the methods of making it, all coming within the spirit of this invention, will, no doubt, readily suggest themselves to those skilled in the art. Hence, it is desired that the foregoing description shall be considered as illustrative and not in a limiting sense.

What is claimed is:

1. In a transistor having an emitter region of one conductivity type and a base region of an opposite conductivity type, the improvement comprising:

a collector region of said one conductivity type disposed adjacent to said base region, said collector region comprising at leaset three layers having resistivities that decrease in the direction away from said base region, respectively, the layer next to said base region having about the same order of magnitude of thickness as that of the next adjacent layer.

2. In a transistor of semiconductor material having an emitter region of one conductivity type, a base region of an opposite conductivity type, and a substrate collector layer of degenerate semiconductor material of said one conductivity type, the improvement comprising:

a collector region comprising at least two collector layers of different resistivities, respectively, one of said two collector layers being adjacent to said base region and the other of said two collector layers being adjacent to said substrate collector layer, said one collector layer having a resistivity that is higher than that of said other collector layer, and a thickness that is about the same order of magnitude as that of said other collector layer.

3. A semiconductive device comprising:

a substrate collector layer of degenerate semiconductor material of one conductivity type, a first epitaxial layer of said one conductivity type on said substrate collector layer, a second epitaxial layer of said one conductivity type on said first layer, a first region of an opposite conductivity type diffused in said second layer, and a second region of said one conductivity type diffused in said first region, said substrate collector layer, said first epitaxial layer and said second epitaxal layer having resistivities that increase stepwise, respectively, in the order named, and said first epitaxial layer having a thickness that is about the same order of magnitude as that of said second epitaxial layer.

4. A semiconductive device comprising:

a degenerate substrate collector layer of one conductivity type, a first epitaxial collector layer of said one conductivity type on said substrate collector layer, a second epitaxial collector layer of said one conductivity type on said first layer and having a thickness that is about the same order of magnitude as that of said first layer, a first region of an opposite conductivity type diffused in said second layer, and a second region of said one conductivity type on said first region, said second layer having a higher resistivity than that of said first layer, and said substrate collector layer having a resistivity that is less than one one-hundredth of that of said first layer.

5. A semiconductive device comprising:

a substrate collector layer of degenerate semiconductive material of one conductivity type, a first layer of said one conductivity type on said substrate collector layer, a second layer of said one conductivity type on said first layer and having a thickness that is about the same order of magnitude as that of said first layer, a first region of an opposite conductivity type on said second layer, and a second region of said one conductivity type on said first region, said second layer having a resistivity that is between four and fifty times greater than that of said first layer, and said substrate collector layer having a resistivity that is less than one one-hundredth of that of said first layer.

References Cited

UNITED STATES PATENTS

| | | | |
|---|---|---|---|
| 3,131,098 | 4/1964 | Kresek et al. | 148—175 |
| 3,145,447 | 8/1964 | Rummel | 29—25.3 |
| 3,220,894 | 11/1965 | Ruchert et al. | 148—33 |
| 3,153,731 | 10/1964 | Shombert | 307—88.5 |
| 3,271,208 | 9/1966 | Allegretti | 148—175 |

JOHN W. HUCKERT, *Primary Examiner.*

A. M. LESNIAK, *Assistant Examiner.*